US011158705B2

(12) United States Patent
Weber

(10) Patent No.: US 11,158,705 B2
(45) Date of Patent: Oct. 26, 2021

(54) METHOD FOR FORMING A SUPERJUNCTION TRANSISTOR DEVICE

(71) Applicant: Infineon Technologies Austria AG, Villach (AT)

(72) Inventor: Hans Weber, Bayerisch Gmain (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 16/697,419

(22) Filed: Nov. 27, 2019

(65) Prior Publication Data

US 2020/0176559 A1 Jun. 4, 2020

(30) Foreign Application Priority Data

Nov. 30, 2018 (DE) .......................... 102018130444.7

(51) Int. Cl.
*H01L 29/06* (2006.01)
*H01L 29/10* (2006.01)
(Continued)

(52) U.S. Cl.
CPC ...... *H01L 29/0634* (2013.01); *H01L 21/2253* (2013.01); *H01L 21/26513* (2013.01);
(Continued)

(58) Field of Classification Search
CPC ............. H01L 29/0634; H01L 29/0638; H01L 29/0696; H01L 29/1095; H01L 29/0834; H01L 21/26513; H01L 21/2253; H01L 21/324; H01L 29/66333; H01L 29/7395; H01L 29/41766; H01L 29/66734; H01L 29/7813; H01L 29/7811; H01L 29/7396; H01L 21/26586; H01L 29/4238;
(Continued)

(56) References Cited

U.S. PATENT DOCUMENTS 6,949,798 B2  9/2005  Nitta et al.
2006/0138536 A1  6/2006  Kouzuki et al.
(Continued)

FOREIGN PATENT DOCUMENTS

DE  102007026745 A1 * 12/2008  ......... H01L 29/7802
DE  102007026745 A1  12/2008
DE  102016115759 A1  3/2018

*Primary Examiner* — Mohammad M Hoque
(74) *Attorney, Agent, or Firm* — Murphy, Bilak & Homiller, PLLC

(57) ABSTRACT

A method includes forming active regions of plurality of transistor cells in an inner region of a semiconductor body, each transistor cell includes a drift region of a first doping type and a compensation region of a second doping type, and forming a field stop region in an edge region of the semiconductor body. Forming the drift and compensation regions includes: forming a plurality of semiconductor layers; in each of the semiconductor layers, before forming a next layer, forming a plurality of first trenches and implanting dopant atoms of the first and/or second doping type into sidewalls of the plurality of first trenches. Forming the field stop region includes: in each semiconductor layer of a selection of the plurality of semiconductor layers, forming at least one second trench and implanting first and/or second type dopant atoms at least into one surface of the at least one second trench.

21 Claims, 12 Drawing Sheets

(51) Int. Cl.
*H01L 29/08* (2006.01)
*H01L 29/66* (2006.01)
*H01L 29/78* (2006.01)
*H01L 21/265* (2006.01)
*H01L 21/225* (2006.01)
*H01L 21/324* (2006.01)
*H01L 29/739* (2006.01)

(52) U.S. Cl.
CPC ........ *H01L 21/324* (2013.01); *H01L 29/0638* (2013.01); *H01L 29/0696* (2013.01); *H01L 29/0834* (2013.01); *H01L 29/1095* (2013.01); *H01L 29/66333* (2013.01); *H01L 29/66712* (2013.01); *H01L 29/7395* (2013.01); *H01L 29/7802* (2013.01)

(58) Field of Classification Search
CPC ......... H01L 29/7397; H01L 21/823487; H01L 29/66666; H01L 29/66712–66734; H01L 29/7802–7815; H01L 29/7827–7828; H01L 29/78642; H01L 51/057; H01L 27/2454; H01L 21/823885
USPC .......................................................... 438/13
See application file for complete search history.

(56) References Cited

U.S. PATENT DOCUMENTS

2006/0160309 A1     7/2006   Hshieh
2009/0166722 A1*    7/2009   Hebert ................ H01L 29/7802
                                                257/328
2014/0217496 A1*    8/2014   Kachi .................. H01L 21/225
                                                257/330
2018/0358433 A1*   12/2018   Su ....................... H01L 29/0623

* cited by examiner

METHOD FOR FORMING A SUPERJUNCTION TRANSISTOR DEVICE

BACKGROUND

This disclosure relates in general to a method for forming a superjunction transistor device, in particular a vertical superjunction transistor device.

A vertical superjunction transistor device includes a plurality of transistor cells. Each of the transistor cells includes a source region, a body region, a drift region, a compensation region, and a drain region in an inner region of the semiconductor body. The source region and the drain region of each cell are spaced apart from each other in a vertical direction of the semiconductor body, wherein the drain regions of the plurality of transistor cells may be formed by one contiguous semiconductor layer. A vertical superjunction transistor device may further include a field stop region that is arranged in an edge region of the semiconductor body and may form a closed loop around the inner region. The field stop region is of the same doping type as the drift regions, but more highly doped.

Forming the drift and compensation regions of the plurality of transistor may include forming a plurality of semiconductor layers one on top of the other, forming a plurality of trenches in each of these semiconductor layers, implanting dopant atoms into sidewalls of these trenches, and a thermal process that diffuses and activates the implanted dopant atoms. There is a need for additionally forming a field stop region in an efficient way reasonable additional cost.

SUMMARY

One example relates to method for forming a transistor device is disclosed. The method includes: forming active regions of plurality of transistor cells in an inner region of a semiconductor body, wherein each transistor cell includes a drift region of a first doping type and a compensation region of a second doping type; and forming a field stop region of one of the first doping type and the second doping in an edge region of the semiconductor body. Forming the drift and compensation regions includes: forming a plurality of semiconductor layers one on top of the other; in each of the plurality of semiconductor layers, before forming a respective next one of the plurality of semiconductor layers, forming a plurality of first trenches and implanting at least one of dopant atoms of the first doping type and dopant atoms of the second doping type into sidewalls of the plurality of first trenches. Further, forming the field stop region includes: in each semiconductor layer of a selection of the plurality of semiconductor layers, forming at least one second trench and implanting dopant atoms of one of the first and second doping type at least into one surface of the at least one second trench.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
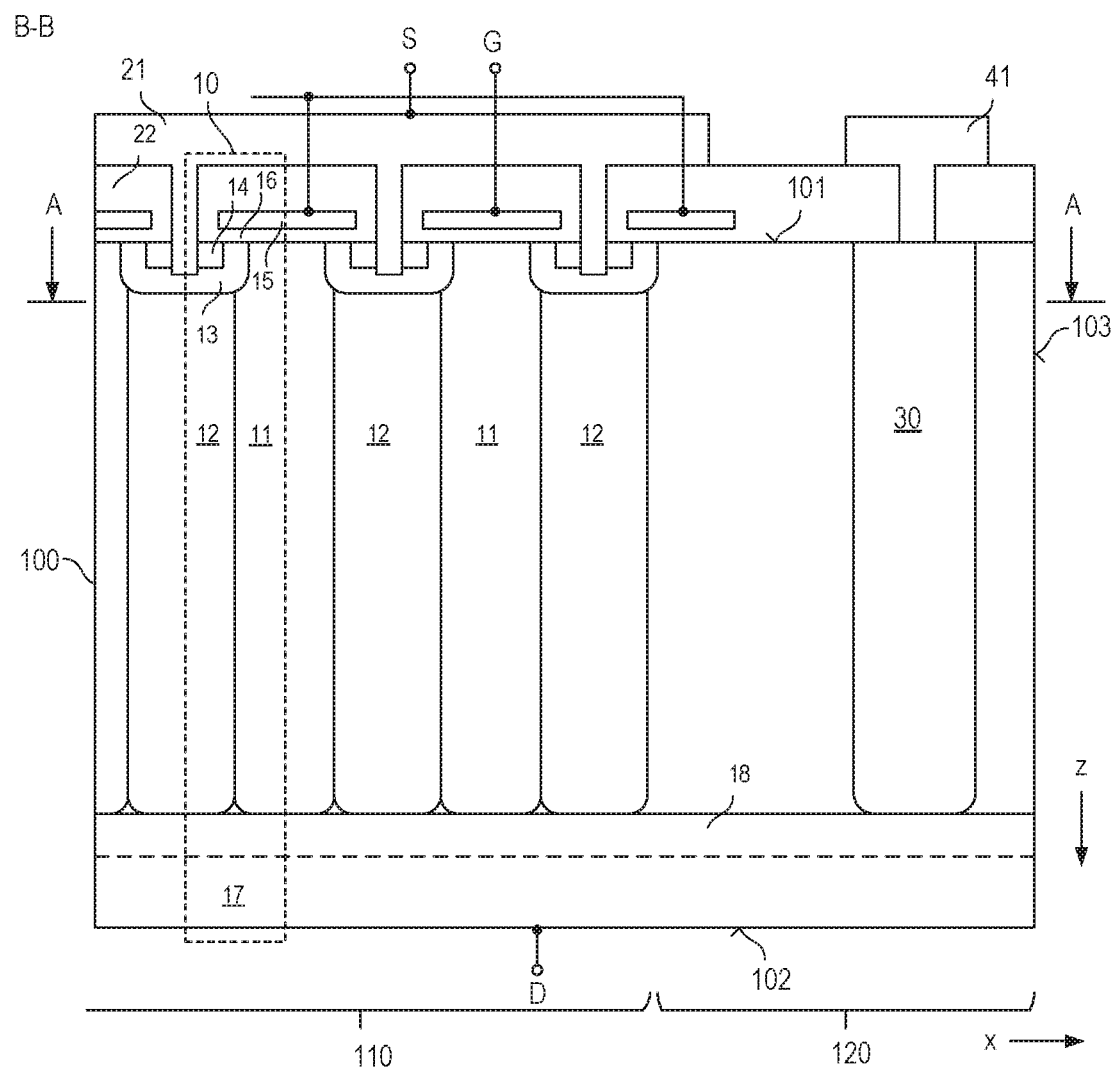
FIG. 1 schematically illustrates a vertical cross sectional view of a vertical superjunction transistor device.

FIG. 1 schematically illustrates a vertical cross sectional view of one example of superjunction transistor device. The transistor device includes a semiconductor body 100 with a first surface 101, a second surface 102 opposite the first surface 101, and an edge surface 103 extending from the first surface 101 to the second surface 102. The second surface 102 is spaced apart in a vertical direction z of the semiconductor body 100 from the first surface 101. The "vertical direction z" is a direction perpendicular to the first and second surfaces 101, 102. According to one example, the semiconductor body 100 includes a monocrystalline semiconductor material. Examples of the monocrystalline semiconductor material include, but are not restricted to, silicon (Si), silicon carbide (SiC), gallium arsenide (GaAs), gallium nitride (GaN), or the like.

The semiconductor body 100 includes an inner region 110 and an edge region 120. The edge region 120 is arranged between the edge surface 103 and the inner region 110 and, in a horizontal plane, surrounds the inner region 110. The "horizontal plane" is a plane parallel to the first and second surface 101, 102.

Referring to FIG. 1, the transistor device includes a plurality of transistor cells 10, wherein each of these transistor cells 10 includes active device regions in the inner region 110 of the semiconductor body 100. The active device regions of each transistor cell 10 include a drift region 11 of the first doping type and a compensation region 12 of a second doping type, complementary to the first doping type. Further, the active device regions of each transistor cell 10 include a body region 13 of the second doping type and a source region 14 of the first doping type, wherein the body region 13 is arranged between the source region 14 and the drift region 11 so that the source region 14 is separated from the drift region 11 by the body region 13. The compensation region 12 adjoins the body region 13, according to one example. Further, the active device regions of each transistor cell 10 include a drain region 17. The drain region 17 may adjoin each of the drift region 11 and the compensation region 12. Optionally, as illustrated in dashed lines in FIG. 1, a buffer region of the first doping type may be arranged between the drain region 17 and each of the drift region 11 and the compensation region 12.

According to one example, the semiconductor body 100 includes monocrystalline silicon and the individual active device regions are implemented such that a respective doping concentration is in a range as outlined in the following: drift region 11: between $1E15$ cm$^{-3}$ and $1E17$ cm$^{-3}$; compensation region 12: between $1E15$ cm$^{-3}$ and $1E17$ cm$^{-3}$; body region 13: between $1E17$ cm$^{-3}$ and $1E18$ cm$^{-3}$; source region 14: between $1E18$ cm$^{-3}$ and $1E21$ cm$^{-3}$; drain region 17: between $1E18$ cm$^{-3}$ and $1E21$ cm$^{-3}$; optional buffer region 18: between $1E15$ cm$^{-3}$ and $1E17$ cm$^{-3}$.

Referring to FIG. 1, the drain regions 17 of each of the plurality of transistor cells 10 can be formed by one contiguous semiconductor region, which is referred to as drain region of the transistor device in the following. Further, the drift regions 11 of two neighboring transistor cells 10 can be formed by one contiguous semiconductor region of the first doping type, and the compensation regions 12 of two (other) transistor cells 10 can be formed by a contiguous semiconductor region of the second doping type.

Referring to FIG. 1, each transistor cell further includes a gate electrode 15 that is arranged adjacent the body region 13 and that is dielectrically insulated from the body region 13 by a gate dielectric 16. The gate electrode 15 serves to control a conducting channel in the body region 13 between the source region 14 and the drift region 11. The gate electrodes 15 of the individual transistor cells are connected to a gate node G. The gate node G as well as connections between the gate electrodes 15 and the gate node G are only schematically illustrated in FIG. 1. Further, the source and body regions 14, 15 of the individual transistor cells 10 are connected to a source electrode 21 that is electrically insulated from the gate electrodes 15 by an insulation layer 22. The source electrode 21 is connected to a source node S or forms a source node S of the transistor device. Further, the drain region 17 is connected to a drain node D of the transistor device.

The transistor device can be an n-type transistor device or a p-type transistor device. In an n-type transistor device, the source regions 14 and the drift regions 11 are n-type semiconductor regions and the body regions 13 and the compensation regions 12 are p-type semiconductor regions. In a p-type transistor device the doping types of the individual active device regions are complementary to the doping type of corresponding device regions in an n-type transistor device. Further, the transistor device can be implemented as a MOSFET (Metal Oxide Semiconductor Field-Effect Transistor). In this case, the drain region 17 has the same doping type as the source region 14. According to another example, the transistor device is implemented as an IGBT (Insulated Gate Bipolar Transistor). In this case, the drain region 17 has a doping type complementary to the doping type of the source region 14.

The transistor device can be operated in an on-state or an off-state. In the on-state, the gate electrodes 15, by applying a suitable voltage (gate-source voltage) between the gate node G and the source node S, are driven such that there is a conducting channel in the body region 13 between the source region 14 and the drift region 11, so that a current can flow between the drain node D and the source node S when a voltage (drain-source voltage) higher than zero is applied between these circuit nodes D, S. In the off-state, the gate electrodes 15 are driven such that the conducting channel in the body regions 13 between the source regions 14 and the drift regions 11 are interrupted. In the off-state, when applying a voltage between the drain node D and the source node S that reverse biases pn-junctions between the drift regions 11 on one side and the body regions 13 and compensations regions 12 on the other side space charge regions (depletion regions) expand in the semiconductor body 100. In this operating state, a current flow through the transistor device is prevented.

Referring to FIG. 1, the transistor device further includes a field stop region 30 in the edge region 120. According to one example, the field stop region 30 is of the first doping type and extends from the first surface 101 to the drain region 17 or the optional buffer region 18. The drain region 17, the optional buffer region 18, and the field stop region 30 form a well of the first doping type around the other active device regions (drift regions 11, compensation region 12, body regions 13, source regions 14) located in the inner region 110 of the semiconductor body 100. The electrical potential of this well essentially equals a drain potential, which is the electrical potential of the drain node D.

According to another example, the field stop region 30 is of the second doping type complementary to the first doping type. In the following, just for the purpose of illustration it is assumed that the field stop region 30 is of the first doping type, so that dopant atoms of the first doping type are introduced into the semiconductor body 100 for forming the field stop region. However, in each of these example, dopant atoms introduced into the semiconductor body 100 for forming a field stop region 30 of the first doping type may be replaced by dopant atoms of the second doping type for forming a field stop region 30 of the second doping type. A field stop region of the second doping type may be implemented, for example, in a source-down transistor in which the drain electrode and the gate electrode are arranged on the same side of the semiconductor body.

Figure 2:
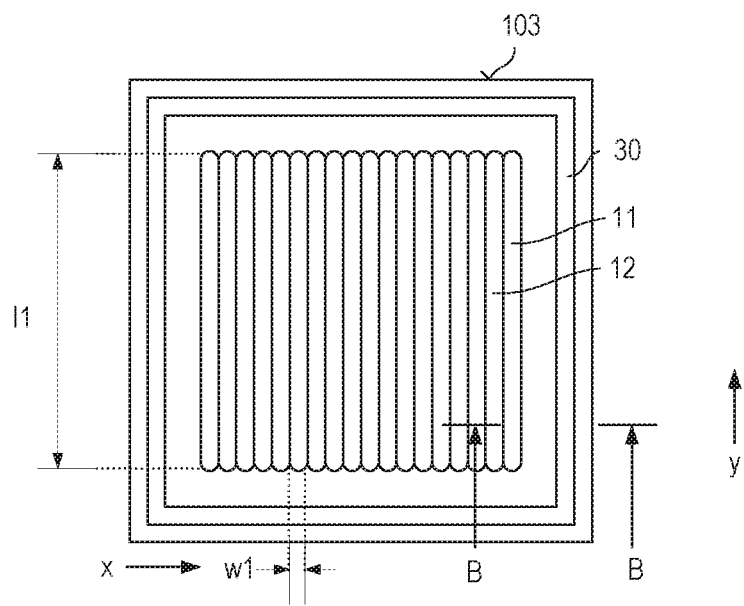
FIG. 2 schematically illustrates a horizontal cross sectional view of a transistor device of the type shown in FIG. 1.

FIG. 1 shows one section of the transistor device in a vertical section plane that is defined by the vertical direction z of the semiconductor body 100 and a first lateral (horizontal) direction x. FIG. 2 schematically illustrates a horizontal cross sectional view of the semiconductor body 100 in a horizontal section plane A-A that is defined by the first lateral direction x and the second lateral direction y. Referring to FIG. 2, the field stop region 30, in the horizontal plane, may form a closed loop (a ring) around the active device regions in the inner region 110, wherein in FIG. 2 the drift and compensation regions 11, 12 are schematically illustrated.

Referring to the example illustrated in FIG. 2, the drift and compensation regions 12 can be elongated in the second horizontal direction y that is perpendicular to the first horizontal direction x. "Elongated" according to one example means that a length of these drift and compensation regions is significantly greater than a width. According to one example, a ratio l1/w1 between the length l1 and the width w1 is at least 10, at least 100, or at least 1000. In the example illustrated in FIG. 2, the length l1 of the drift and compensation regions 11, 12 is the dimension in the second horizontal direction y, and the width w1 is the dimension in the first horizontal direction x.

Figure 3:
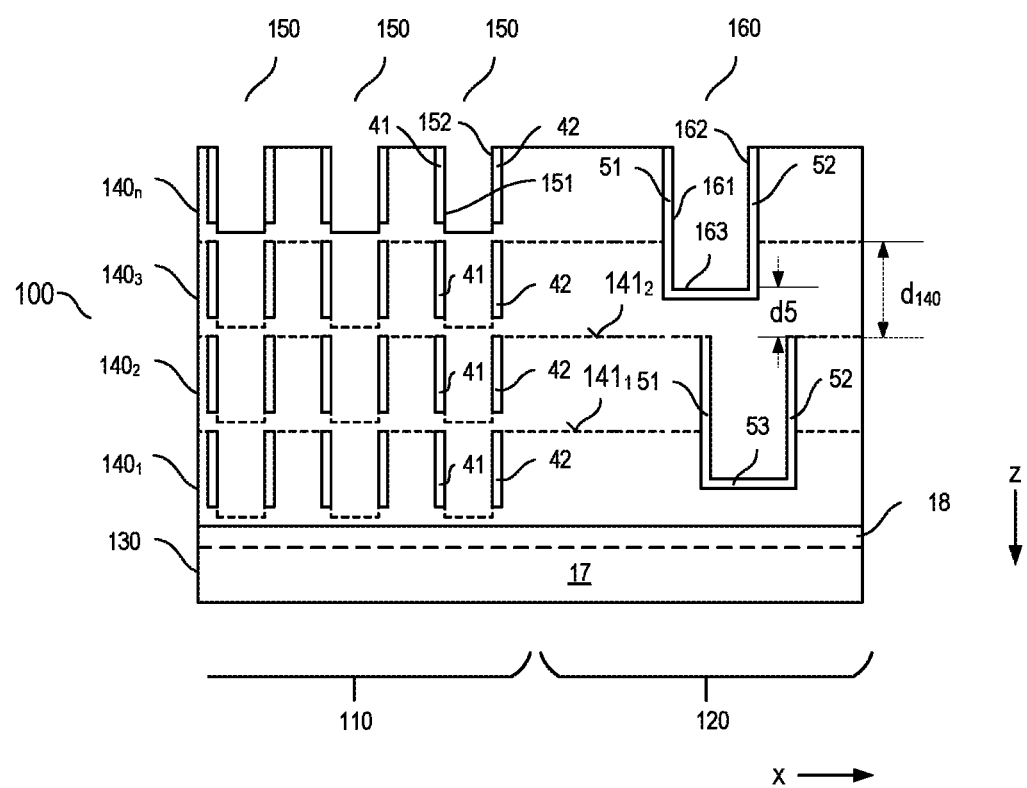
FIG. 3 illustrates a vertical cross sectional view of a plurality of semiconductor layers after forming first trenches in each of the semiconductor layers and implanting dopant atoms into sidewalls of the first trenches, and after forming second trenches in a selection of the semiconductor layers and implanting dopant atoms into sidewalls of the second trenches.

FIG. 3 illustrates one example of a method for forming the drift and compensation regions 11, 12 and the field stop region 30 after several process steps. More specifically, FIG. 1 illustrates the semiconductor body 100 after several process steps of forming the drift and compensation regions 11, 12. Referring to FIG. 3, the method includes forming a plurality of semiconductor layers $140_1$-$140_n$ one on top of the other, forming a plurality of first trenches 150 in each of the plurality of semiconductor layers $140_1$-$140_n$, and implanting dopant atoms into opposite first and second sidewalls 151, 152 of each of the plurality of trenches 150. First implanted regions 41 are formed by implanting the dopant atoms into the first sidewalls 151, and second implanted regions 42 are formed by implanting the dopant atoms into the second sidewalls 152. According to one example, forming each of the plurality of semiconductor layers $140_1$-$140_n$ includes an epitaxial growth process so that each of the semiconductor layers $140_1$-$140_n$ is a monocrystalline epitaxial layer. Referring to FIG. 3, a first one or lowermost one $140_1$ of the plurality of semiconductor layers $140_1$-$140_n$ is grown on a carrier 130. According to one example, the carrier 130 is a monocrystalline semiconductor substrate that forms the drain region 17 of the finished semiconductor device. Optionally, an epitaxial layer that forms the buffer region 18 is grown on the substrate 130 before growing the lowermost semiconductor layer $140_1$.

The semiconductor body 100 with the substrate 130, the optional epitaxial layer forming the buffer region 18 grown on the substrate 130, and the plurality of semiconductor layers $140_1$-$140_n$ is a monocrystalline semiconductor layer. Thus, in the semiconductor body 100, there are no visible borders between the individual semiconductor layers $140_1$-$140_n$. However, for illustration purposes borders between the individual semiconductor layers $140_1$-$140_n$ are illustrated in dashed lines in FIG. 3.

Further, forming the plurality of semiconductor layers $140_1$-$140_n$ one on top of the other and on top of the substrate 130 may take place on a wafer level. That is, a plurality of semiconductor bodies 100 can be processed at once by being part of a wafer onto which a plurality of semiconductor layers are epitaxially grown, wherein the wafer is divided at a later stage of the manufacturing process in order to form a plurality of semiconductor bodies 100. Edge surfaces 103 of the individual semiconductor bodies 100 are formed by dividing the wafer into the individual semiconductor bodies 100. Thus, at the manufacturing stage illustrated in FIG. 3, the edge surface 103 has not necessarily been formed yet. In this case, reference character 103 illustrates where the edge surface of the semiconductor body 100 will be after forming the plurality of semiconductor bodies 100 from one wafer.

In the example illustrated in FIG. 3, the lowermost semiconductor layer $140_1$ has been formed on the substrate 130 and the other semiconductor layers $140_2$-$140_n$ have been formed on top of a respective other one of the semiconductor layers $140_1$-$140_n$. That is, a second semiconductor layer $140_2$ has been formed on the first semiconductor layer $140_1$, a third semiconductor layer $140_3$ has been formed on the second semiconductor layer $140_2$, and so on. In the following, $140_i$ denotes an arbitrary one of the plurality of semiconductor layers $140_1$-$140_n$. Forming one semiconductor layer $140_i$ on top of another semiconductor layer $140_{i-1}$ includes forming the semiconductor layer $140_i$ on top of a surface $141_{i-1}$ of the previous semiconductor layer and in the trenches of the previous semiconductor layer $140_{i-1}$.

FIG. 3 illustrates the semiconductor body 100 after forming each of the plurality of semiconductor layers $140_1$-$140_n$ so that the first trenches 150 in the semiconductor layers $140_1$-$140_{n-1}$ have been filled while the first trenches 150 in an uppermost one $140_n$ of the semiconductor layers $140_1$-$140_n$ are still open. Just for the purpose of illustration, the plurality of semiconductor layers $140_1$-$140_n$ includes n=4 semiconductor layers. This, however, is only an example. According to one example, the number n of semiconductor layers is selected from between 2 and 20, in particular from between 3 and 15. According to one example, the semiconductor layers $140_1$-$140_n$ are formed such that their respective thickness $d_{140}$ is between 2 micrometer and 12 micrometers. The thickness $d_{140}$ of one layer $140_i$ is the dimension of the semiconductor layer $140_i$ outside the trenches 150 and in the vertical direction z.

According to one example, the first trenches 150 are elongated trenches. That is, a length, which is a dimension of these trenches 150 in a direction perpendicular to the section plane illustrated in FIG. 3, is much greater than a width, which is a dimension of these trenches 150 in the first horizontal direction x. According to one example, a ratio between the length and the width is at least 10, at least 100, or at least 1000. According to one example, as illustrated in FIG. 3, the first trenches 150 formed in the individual semiconductor layers $140_1$-$140_n$ are aligned in the vertical direction z. Further, the first trenches 150 are formed at positions of the semiconductor layers $140_1$-$140_n$ that form the inner region 110 of the finished semiconductor body 100. The first and second implanted regions 41, 42 form the basis of the drift and compensation regions 11, 12. This is detailed herein further below.

In the example illustrated in FIG. 3, the first trenches 150 have been formed such that each of these trenches 150 is formed inside only one semiconductor layer. That is, each of the trenches 150 formed in a semiconductor layer $140_i$ does not extend into a semiconductor layer $140_{i-1}$ that has been directly formed before the semiconductor layer $140_i$. This, however, is only an example. According to another example (not illustrated) the first trenches 150 formed in one semiconductor layer $140_i$ may extend into the semiconductor layer $140_{i-1}$ formed before.

Referring to FIG. 3, the method further includes forming at least one second trench 160 in each of a selection of the plurality of semiconductor layers $140_1$-$140_n$, and implanting dopant atoms of the first doping type into at least one surface of the second trench 160. In the example illustrated in FIG. 3, dopant atoms of the first doping type have been implanted into a first sidewall 161 of each second trench 160 to form first implanted regions 150, a second sidewall 162 to form second implanted regions 52, and a bottom 163 of each second trench 160 to form third implanted regions 53. This, however, is only an example. According to another example, only one or only two of these regions 51, 52, 53 are formed. According to one example, the selection of the semiconductor layers includes every m-th of the plurality of semiconductor layers $140_1$-$140_n$, wherein m is an integer greater than one (m>1). According to one example, m is selected from between 2 and 5. In this example, there are m−1 semiconductor layers between two selected semiconductor layers. However, it is also possible that the number of semiconductor layers between two neighboring selected semiconductor layers varies. In general, the selection of semiconductor layers comprises two or more of the plurality of semiconductor layers $140_1$-$140_n$ but less than each of the plurality of semiconductor layers $140_1$-$140_n$.

Just for the purpose of illustration, m=2 in the example illustrated in FIG. 3. That is, the selection of semiconductor layers includes every second semiconductor layer of the plurality of semiconductor layers $140_1$-$140_n$. In the example illustrated in FIG. 3, in which the plurality of semiconductor layers $140_1$-$140_n$ includes n=4 semiconductor layer, every second semiconductor layer includes the second semiconductor layer $140_2$ and the n-th semiconductor layer $140_n$. The selection of semiconductor layers, however, not necessarily includes semiconductor layers that are selected in a regular order from the plurality of semiconductor layers $140_1$-$140_n$. That is, m may vary. When, for example, m varies between 2 and 3, the selected semiconductor layers may include a second semiconductor layer $140_2$, a fifth semiconductor layer $150_5$, a seventh semiconductor layer $140_7$, and so on.

Figure 4A:
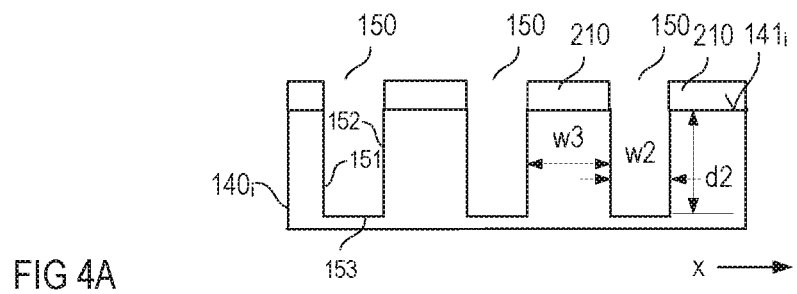
FIGS. 4A to 4C illustrates one example of a method for forming first trenches and implanting dopant atoms into sidewalls of the first trenches.
Figure 4B:
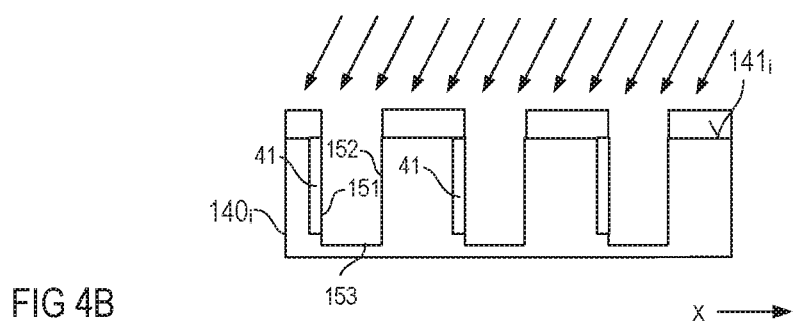
Figure 4C:
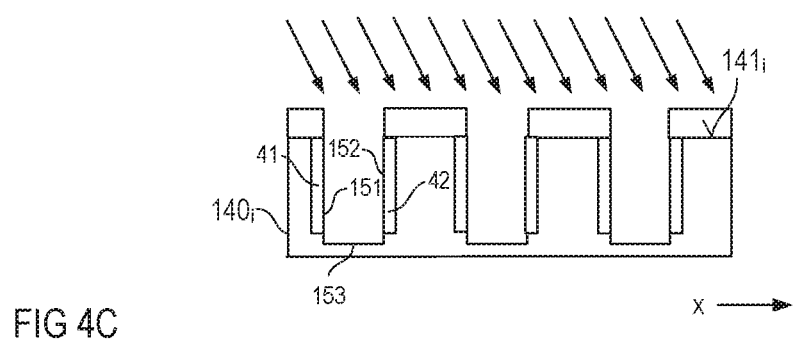

FIGS. 4A to 4C illustrate one example of a method for forming the first trenches 150 and the first and second implanted regions 41, 42 in one semiconductor layer $140_i$. Each of FIGS. 4A to 4C illustrates a vertical cross sectional view of the semiconductor layer $140_i$ during different process steps, wherein only the semiconductor layer $140_i$ is illustrated in these figures and wherein only the section in which the first trenches 150 are produced is illustrated.

Referring to FIG. 4A, the method includes forming a patterned etch mask 210 on top of the surface $141_i$ of the semiconductor layer $140_i$. The etch mask 210 is patterned such that it includes openings at those positions of the surface $141_i$ where the trenches 150 are to be formed. Patterning the etch mask 210 may include a lithographic process. Referring to FIG. 4A, the method further includes etching the first trenches 150 using the etch mask 210. Etching the first trenches 150 includes an anisotropic etching process, for example. According to one example, the first trenches 150 are formed such that an aspect ratio, which is a ratio between a depth d2 and a width w2 of the first trenches 150 is between 1:1 and 5:1, in particular, between 1:1 and 3:1. The "depth d2" of the first trenches 150 is the dimension in the vertical direction z, and the "width w2" of the first trenches 150 is their dimension in the first lateral direction x. A distance w3 between neighboring trenches is between 0.8 times the width w2 and 1.2 times the width w2 of the first trenches 150. The distance between neighboring trenches can also be referred to as width of mesa regions formed between the first trenches 150.

Referring to FIG. 4B, the method further includes forming the first implanted regions 41 along the first sidewalls 151 by implanting dopant atoms into the first sidewalls 151. The implantation process is a tilted implantation process in which an implantation direction is inclined relative to the vertical direction z, so that dopant atoms are implanted into the first sidewalls 151, but not into bottoms 153 of the first trenches 150. According to one example, the implantation process includes forming a protection layer on the surface $141_i$ that prevents dopant atoms from being implanted into the surface $141_i$. According to one example, the etch mask 210 is used as the protection layer. Optionally, the etch mask 210 is removed and a protection layer is formed on the first surface $141_i$.

Referring to FIG. 4C, the method further includes a second implantation process in which dopant atoms are implanted into the second sidewalls 152 in order to form the second implanted regions 42. The second implantation process is also a tilted implantation process so that the dopant atoms are implanted into the sidewalls 152, but not into the bottoms 153 of the trenches 150. The first and second implanted regions 41, 42 form the basis of at least one of the drift regions 11 and the compensation regions 12. More specifically, in a thermal process that is explained herein further below, dopant atoms included in the first and second implanted regions diffuse and are activated so as to form at least one of the drift regions 11 and the compensation regions 12.

The first and second implantation processes can be implemented in various ways, that is, the first and second implanted regions 41, 42 can be formed in various ways:

(a) The semiconductor layer $140_i$ may be formed such that it has a basic doping of one of the first and second doping type, and only dopant atoms of the other one of the first doping type are implanted into each of the first and second sidewalls 151, 152 in the first and second implantation processes. In this case, the implanted dopant atoms in the first and second implanted regions 41, 42—after the thermal process—form one of the drift regions 11 and the compensation regions 12, and the other one of the drift regions 11 and the compensation regions are formed by those sections of the semiconductor layer $140_i$ in which the basic doping of the first doping type is maintained.

(b) The semiconductor layer $140_i$ may be formed such that it is intrinsic (that is, has a basic doping concentration lower than 1E14 $cm^{-3}$), dopants of only one of the first and second doping type are implanted into the first sidewalls 151 in the first implantation process, and dopant atoms of only the other one of the first and second doping type are implanted into the second sidewalls 152 in the second implantation process, so that the first and second implanted regions 41, 42 each include dopant atoms of only one of the first and second doping type. If, for example, the first implanted regions 41 only include dopants of the first doping type and the second implanted regions 42 only include dopants of the second doping type, the first implanted regions 41 form the basis of the drift regions 11 and the second implanted regions 42 form the basis of the compensation regions 12.

(c) According to another example, both dopants of the first doping type and dopants of the second doping type are implanted into each of the first and second sidewalls 151, 152 in each of the first and second implantation process, so that each of the first and second implanted regions 41, 42 includes both dopants of the first doping type and dopants of the second doping type. In this case, each of the first and second implanted regions 41, 42 forms the basis of a drift region and a compensation region. Implanting dopant atoms of both the first doping type and the second doping type into respective ones of the first and second sidewalls 151, 152 may include two implantation sub-processes, a first implantation sub-process in which dopants of the first doping type are implanted, and a second implantation sub-process in which dopants of the second doping type are implanted. According to another example, implanting both dopants of the first doping and dopants of the second doping type into respective ones of the first and second sidewalls 151, 152 includes only one implantation process in which dopants of the first doping type and dopants of the second doping type are implanted at the same time, for example, by implanting molecules that include both dopants of the first doping type and dopants of the second doping type. According to one example, if dopant atoms of both types are implanted into one sidewall, the dopant atoms may be chosen such that they have different diffusion coefficients. According to one example, the first type dopant atoms are arsenic (As) or antimony (Sb) atoms, and the second type dopant atoms are boron (B) atoms. Boron, which is a p-type dopant, diffuses faster than As or Sb, which are n-type dopants.

Figure 5A:
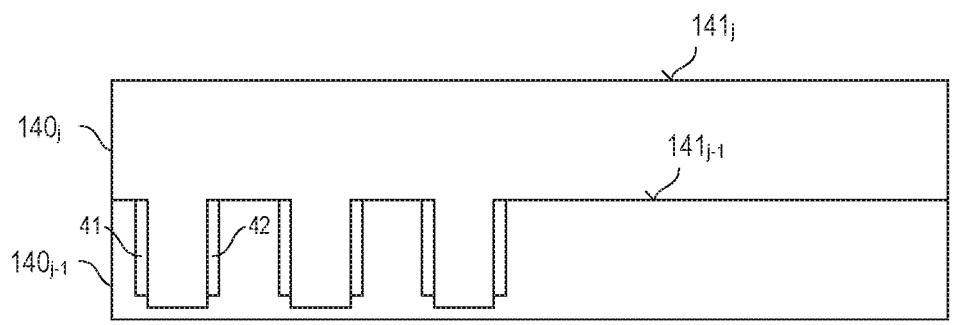
FIGS. 5A to 5D illustrate one example of a method for forming a second trench and implanting dopant atoms into surfaces of the second trench.

FIGS. 5A to 5D illustrate one example of a method for forming a second trench 160 in a selected semiconductor layer $140_j$ and for forming at least one implanted region along at least one sidewall of the second trench 160. Each of FIGS. 5A to 5D illustrates a vertical cross sectional view of the selected semiconductor layer $140_j$ and a semiconductor layer $140_{j-1}$ on top of which the selected semiconductor layer $140_j$ has been formed. FIG. 5A shows the arrangement with the two semiconductor layers after forming the selected semiconductor layer $140_j$ on top of the preceding semiconductor layer $140_{j-1}$. The selected semiconductor layer $140_j$ is formed after the first and second implanted regions 41, 42 have been formed in the preceding semiconductor layer $140_{j-1}$. Forming these first and second implanted regions 41, 42 may include any of the processes explained with reference to FIGS. 4A to 4C.

Figure 5B:
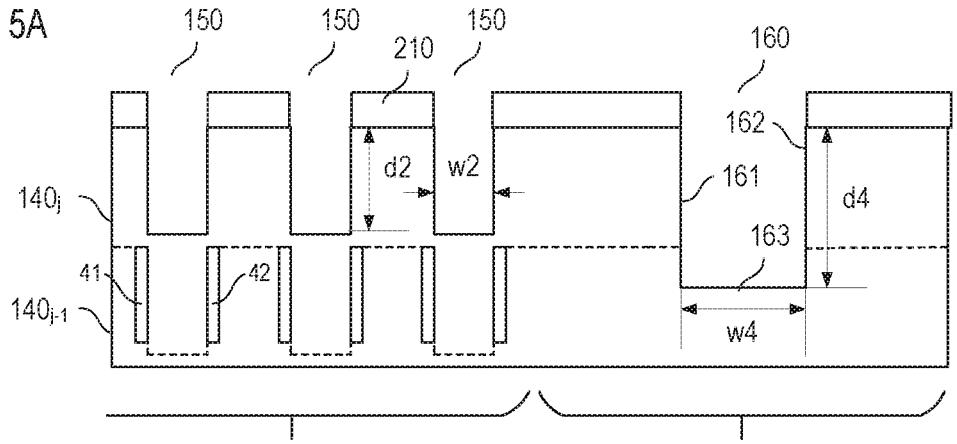

Referring to FIG. 5B, the method further includes forming the first trenches 150 and the second trench 160 in the selected semiconductor layer $140_j$. Forming the first trenches 150 and the second trench 160 may include one etching process using the same etch mask 210, wherein the etch mask 210 includes openings in the inner region 110 for forming the first trenches 150 and an opening in the edge region 120 for producing the second trench 160. The etching process is an anisotropic etching process, for example. In this type of process, a depth of the trenches is dependent on a duration of the etching process and a width of the respective opening in the etch mask. Basically, the longer the etching process, the deeper the trench, and the wider the opening, the deeper the trench that is obtained in a given duration of the etching process.

According to one example, the duration of the etching process is selected such that the first trenches 150 reach the desired depth d2. The depth of the second trench 160 is dependent on a width w4 of the second trench 160 relative to the width of the first trenches 150. According to one example, the opening in the etch mask 210 for producing the second trench 160 is wider than the openings for producing the first trenches 150, so that a width w4 of the second trench 160 is greater than a width w2 of the first trenches 150 (w4>w2). In this case, the second trench 160 is deeper than the first trenches 150, as illustrated in FIG. 5B, that is, d4>d2, where d2 is the depth of the first trenches 150 and d4 is the depth of the second trench 160.

According to one example, the second trench 160 is formed such that it extends into the preceding semiconductor layer $140_{j-1}$.

However, implementing the second trench 160 wider and, therefore, deeper than the first trenches 150 is only an example. According to another example (not illustrated) the second trench 160 is produced such that its width w4 essentially equals the width w2 (w4=w2) of the first trenches 150 and its depth d4 essentially equals the depth d2 (d4=d2) of the first trenches 150.

Figure 5C:
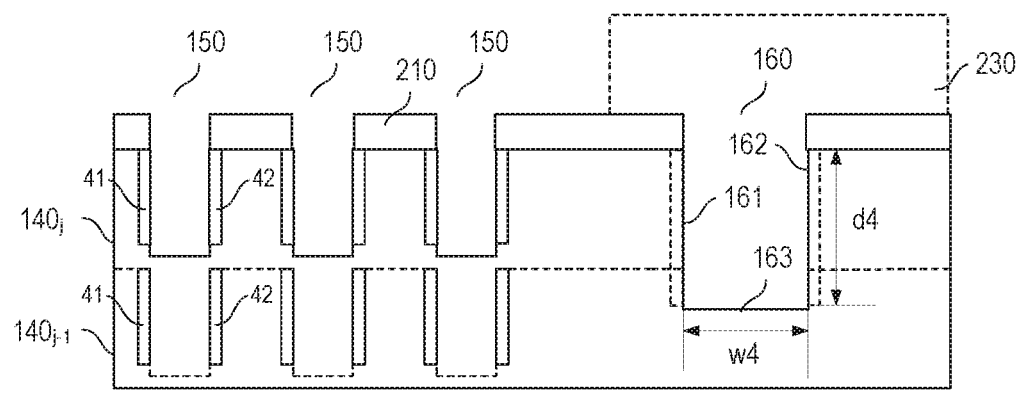

Referring to FIG. 5C, the method further includes forming the first and second implanted regions 41, 42 by implanting dopant atoms into the sidewalls of the first trenches 150. These first and second implanted regions 41, 42 can be formed in accordance with any of the methods explained with reference to FIGS. 4A to 4C. According to one example, the same method is used to form the first and second implanted regions 41, 42 in each of the semiconductor layers $140_1$-$140_n$. That is, in each of the semiconductor layers $140_1$-$140_n$ each of the first and second implanted regions 41, 42 includes dopants of only doping type or in each of the semiconductor layers $140_1$-$140_n$ each of the first and second implanted regions 41, 42 includes both dopants of the first doping type and dopants of the second doping type.

According to one example, the second trench 160 is uncovered during the implantation processes that form the first and second implanted regions 41, 42. In this case, corresponding implanted regions are formed along those first and second sidewalls 161, 162 of the second trench 160 that are parallel to the first and second sidewalls 151, 152 of the first trenches 150. Such implanted regions are illustrated in dashed lines in FIG. 5C. According to another example, a protection layer 230 (illustrated in dashed lines in FIG. 5C) such as a resist layer covers the second trench 160 during the implantation processes so that dopant atoms are not implanted into the sidewalls 161, 162 of the second trench 160.

Figure 5D:
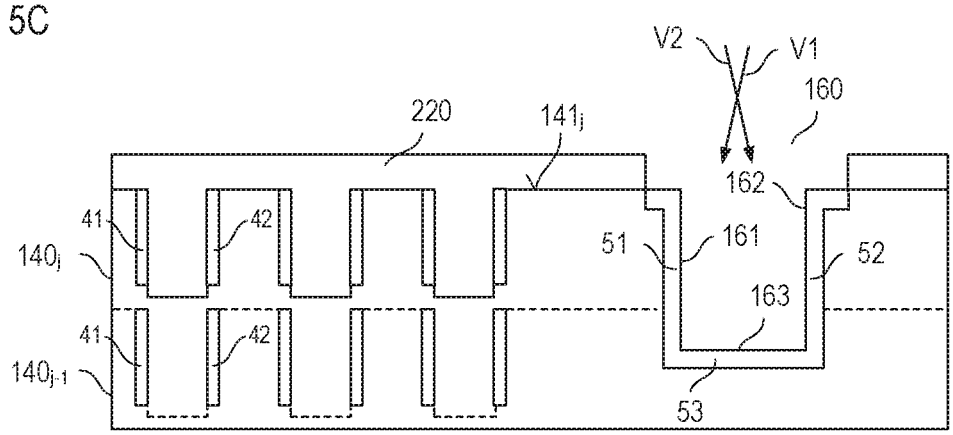

Referring to FIG. 5D, the method further includes implanting dopant atoms of the first doping type into at least one of the surfaces of the second trench 160. The "surfaces" of the second trench 160 include the first sidewall 161, the second sidewall 162, and the bottom 163. Dopant atoms of the first doping type may be implanted into one of these surfaces 161-163, two of these surfaces 161-163, or, as illustrated in FIG. 5D, into each of these surfaces 161-163. Implanting dopant atoms into a surface results in forming an implanted region adjacent the respective surface. In the example illustrated in FIG. 5D, a first implanted region 51 has been formed along the first sidewall 161, a second implanted region 52 has been formed along the second sidewall 162, and a third implanted region 53 has been formed along the bottom 163 of the second trench 160.

Forming the first implanted region 51 may include a first tilted implantation process. In this implantation process, the tilt angle may be selected such that dopant atoms are implanted into the first sidewall 161, only. Alternatively, the tilt angle is selected such that dopant atoms are implanted into the first sidewall 161 and into the bottom 163 so that the first implanted region 53 and (at least sections of) the third implanted region 53 are formed by the same implantation process. Forming the second implanted region 52 may include a second tilted implantation process. In this implantation process, the tilt angle may be selected such that dopant atoms are implanted into the second sidewall 162, only. Alternatively, the tilt angle is selected such that dopant atoms are implanted into the second sidewall 162 and into the bottom 163 so that the first implanted region 53 and (at least sections of) the third implanted region 53 are formed by the same implantation process. Alternatively or additionally to forming the third implanted region 53 by one of the tilted implantation processes, forming the third implanted region may include a non-tilted implantation process, that is, an implantation process in which dopant atoms are implanted into the bottom 163 using an implantation angle of essentially 0°.

Thus, forming the three implanted regions 51, 52, 53 may include two tilted implantation processes, a first implantation process in which the tilt angle is selected such that dopants are implanted into the first sidewall 51 and the bottom 53, and a second implantation process in which the tilt angle is selected such that dopant atoms are implanted into the second sidewall 162 and the bottom 163. An example of the implantation vector in the first implantation process is labeled with V1 in FIG. 5D and an example of the implantation vector in the second implantation process is labeled with V2 in FIG. 5D. Another example of a process for forming the three implanted regions is explained with reference to FIGS. 6A and 6B further below.

In the at least one implantation process for forming the at least one implanted region, a protection layer 220 is formed on the surface $141_j$ such that the protection layer 220 prevents dopant atoms from being implanted into the first trenches 150. The protection layer 220 is a resist layer, for example. The protection layer 220 may be formed after removing the etch mask 210 (as illustrated) or may be formed when the etch mask 210 is still in place (not illustrated). In the first case, the protection layer 210 is formed such that it covers the first trenches 150 and sections of the surface $141_j$ of the semiconductor layer $140_j$ between the first trenches 150. Further, the protection layer covers a section of the surface $141_j$ in the edge region 120 between the first trenches 150 and the second trench 160. The protection layer 210 may entirely cover the surface $141_j$ and only leave the surfaces 161-163 of the second trench 160 uncovered. According to another example (as illustrated) surface sections adjoining the sidewalls 161, 162 of the second trench 160 are not covered by the protection layer 210. A dimension of these surface sections in directions perpendicular to the trench sidewalls 161, 162 is between 10 nanometers (nm) and several micrometers (μm), in particular between 300 nanometers and 1 micrometer.

Referring to the above, the second trench 160 can be formed such that, in the horizontal plane, it forms a closed loop around the inner region 110. According to one example, forming the implanted regions 51, 52, 53 along the sidewalls 161, 162 and the bottom of this type of second trench 160 includes four tilted implantation processes. This is illustrated in FIG. 6.

Figure 6A:
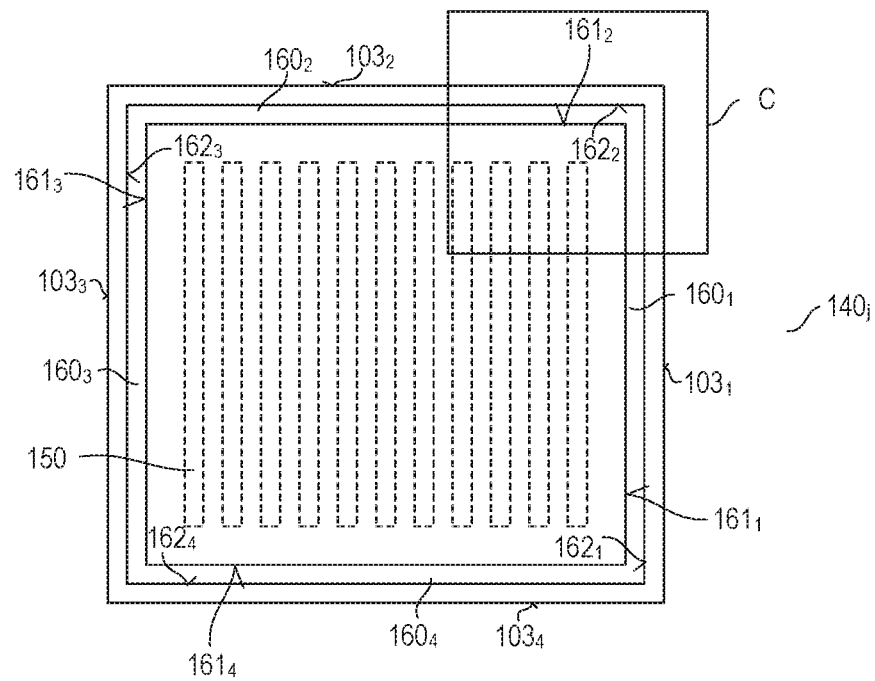
FIGS. 6A and 6B show a top view of a semiconductor layer shown in FIG. 5D during an implantation process.
Figure 6B:
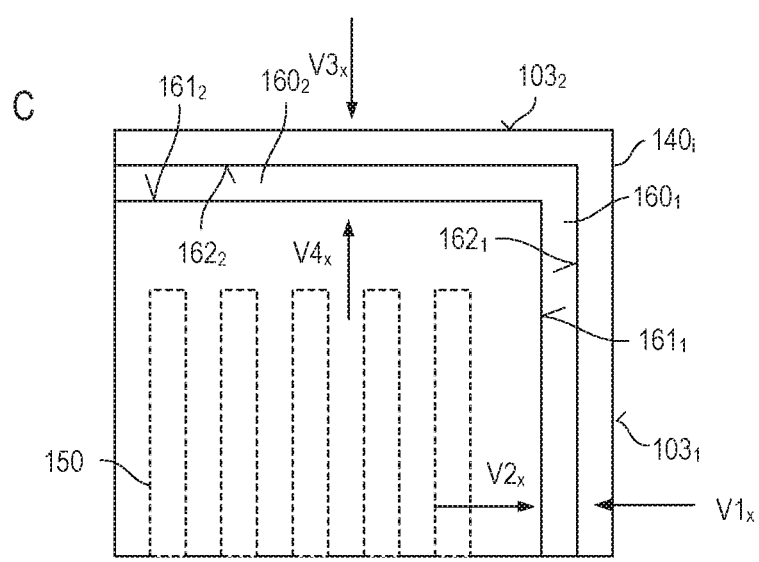

FIGS. 6A and 6B shows a top view of the selected semiconductor layer $140_j$ during the implantation process. More specifically, FIG. 6A shows a top of the selected semiconductor layer $140_j$ and FIG. 6B shows a top view of one of four corner sections of the selected semiconductor layer $140_j$. The second trench 160 that forms a closed loop around the inner region 110 includes four trench sections, a first trench section $160_1$ that is essentially parallel to a first section $103_1$ of the edge surface 103, a second trench section $160_2$ that is essentially parallel to a second section $103_2$ of the edge surface 103 and essentially vertical to the first trench section $160_1$, a third trench section $160_3$ that is essentially parallel to a third section of the edge surface 103 and essentially parallel to the first trench section $160_1$, and a fourth trench section $160_4$ that is essentially parallel to a fourth section of the edge surface 103 and essentially parallel to the second trench section $160_2$. Each of the four trench sections $160_1$, $160_2$, $160_3$, $160_4$ has a first sidewall $161_1$, $161_2$, $161_3$, $161_4$ and a second sidewall $162_1$, $162_2$, $162_1$, $162_2$, wherein the first sidewalls $161_1$, $161_2$, $161_3$, $161_4$ are also referred to as inner sidewalls and the second sidewalls $162_1$, $162_2$, $162_3$, $162_4$ are also referred to as outer sidewalls in the following.

The implantation angles in the four tilted implantation processes may be selected such that in each of these implantation processes dopant atoms are implanted into one inner sidewall and one outer sidewall of a pair of parallel trench sections, and into the bottoms of a second pair of trench sections that is different from the first pair. For example,
(1) in a first implantation process, dopant atoms of the first doping type are implanted into the inner sidewall $161_1$ of the first trench section $160_1$, the outer sidewall of the third trench section $160_3$ and the bottoms of the second trench section $160_2$ and the fourth trench section $160_4$;
(2) in a second implantation process, dopant atoms of the first doping type are implanted into the outer sidewall $161_1$ of the first trench section $160_1$, the inner sidewall of the third trench section $160_3$ and the bottoms of the second trench section $160_2$ and the fourth trench section $160_4$;
(3) in a third implantation process, dopant atoms of the first doping type are implanted into the inner sidewall $161_2$ of the second trench section $160_2$, the outer sidewall of the fourth trench section $160_4$ and the bottoms of the first trench section $160_1$ and the third trench section $160_3$; and
(4) in a fourth implantation process, dopant atoms of the first doping type are implanted into the outer sidewall $161_2$ of the second trench section $160_2$, the inner sidewall of the fourth trench section $160_4$ and the bottoms of the first trench section $160_1$ and the third trench section $160_3$.

Horizontal components $V1_x$, $V2_x$, $V3_x$, $V4_x$ of implantation vectors in these four tilted implantation processes are illustrated in FIG. 6B. An implantation process with four tilted implantation processes in which the implantation angles are selected such that dopant atoms are implanted into inner and outer sidewalls of a loop-shaped trench is sometimes referred to as quad-mode implantation process.

Optionally, the tilt angle in the first implantation process is such that dopant atoms are also implanted into the bottoms of the first trench section $160_1$ and the third trench section $160_3$ and/or the tilt angle in the second implantation process is such that dopant atoms are also implanted into the bottoms of the first trench section $160_1$ and the third trench section $160_3$ and/or the tilt angle in the third implantation process is such that dopant atoms are also implanted into the bottoms of the second trench section $160_2$ and the fourth trench section $160_4$ and/or the tilt angle in the fourth implantation process is such that dopant atoms are also implanted into the bottoms of the second trench section $160_2$ and the fourth trench section $160_4$.

The implantation dose in the individual implantation processes is dependent on the tilt angle(s), the number of implantation processes in each selected semiconductor layer $140_j$, and the number of selected semiconductor layers in which a second trench 160 is formed. As will be outlined further below, the field stop region 30 is formed by diffusing the dopants included in the implanted regions 51, 52, 53. Basically, the overall number of dopant atoms introduced into the implanted regions 51, 52, 53 should be high enough to result in a field stop region with a desired effective horizontal dopant dose. The "effective horizontal dopant dose" in the field stop region 30 is the integral of the effective doping concentration in a horizontal direction. More specifically, the field stop region 30 has four sections, wherein each of these sections is essentially parallel to one sidewall section $103_1$-$103_4$. The effective dopant dose of one section of the field stop region is the integral of the effective doping concentration in a horizontal direction that is perpendicular to that sidewall section that is parallel to the respective section of the field stop region. According to one example, the implantation doses are such that the effective horizontal dopant dose is higher than $2E12$ $cm^{-2}$.

Figure 7A:
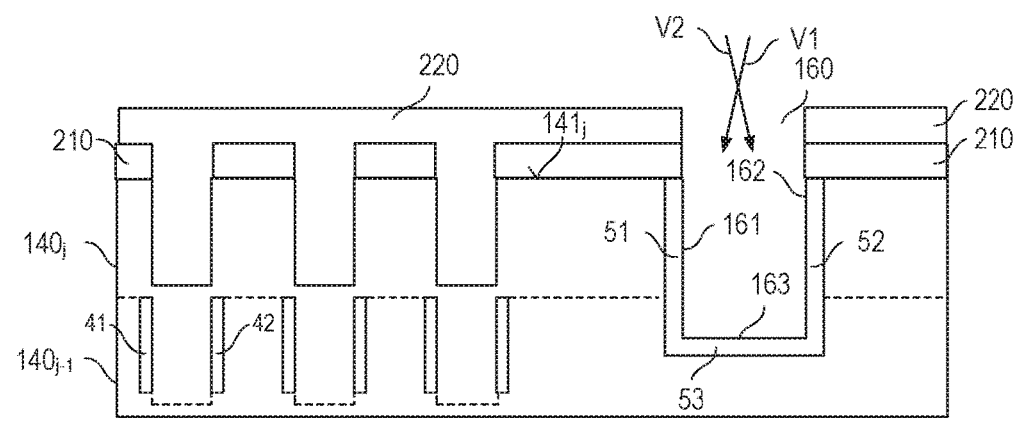
FIGS. 7A and 7B illustrate a modification of the method illustrated in FIGS. 5A to 5D.
Figure 7B:
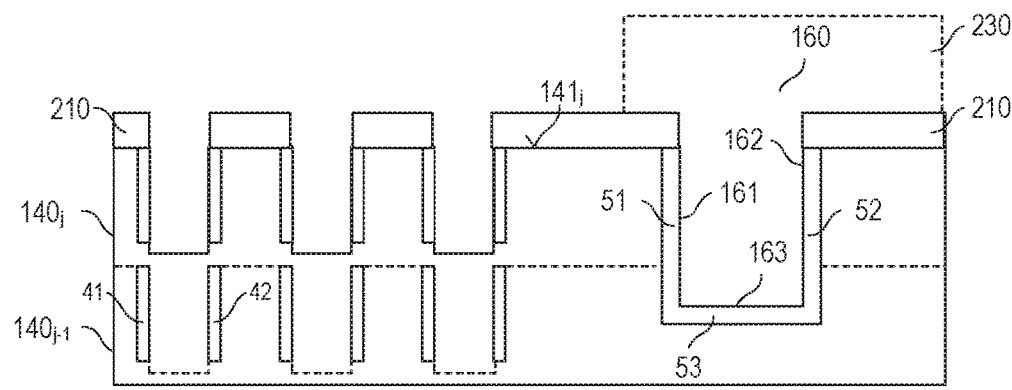

In the example illustrated in FIGS. 5A to 5D, the first and second implanted regions 41, 42 have been formed in the selected semiconductor layer $140_j$ before forming the second trench 160. This, however, is only an example. According to another example illustrated in FIGS. 7A and 7B, the dopant atoms are implanted into the surfaces 161-163 of the second trench 160 before forming the first and second implanted regions 41, 42 along the sidewalls 151, 152 of the first trenches 150. In this example, the protection layer 210 may be formed on the etch mask 210, wherein the etch mask 210 acts as protection layer in the process of forming the first and second implanted regions 41, 42 and prevents dopant atoms from being implanted into the surface $141_j$.

Figure 8:
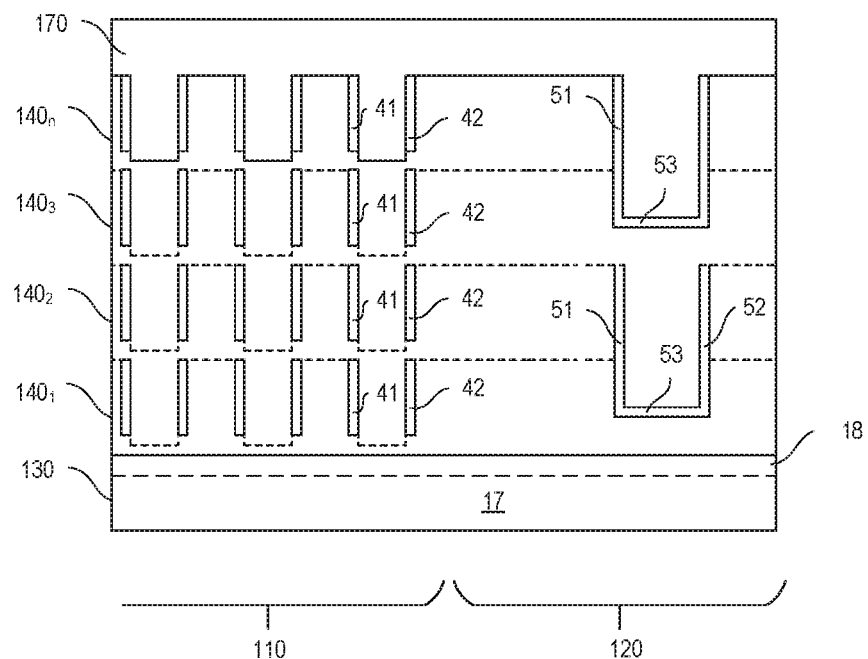
FIG. 8 illustrates forming a further semiconductor layer on top of an uppermost one of the plurality of semiconductor layers.

FIG. 8 shows the arrangement with the plurality of semiconductor layers $140_1$-$140_n$ after a further process step. This process step includes forming a further semiconductor layer 170 on top of the uppermost semiconductor layer $140_n$. This further semiconductor layer 170 fills the first trenches 150 and the second trench 160 in the uppermost semiconductor layer $140_n$. Forming this further semiconductor layer 170 may include an epitaxial growth process.

Figure 9:
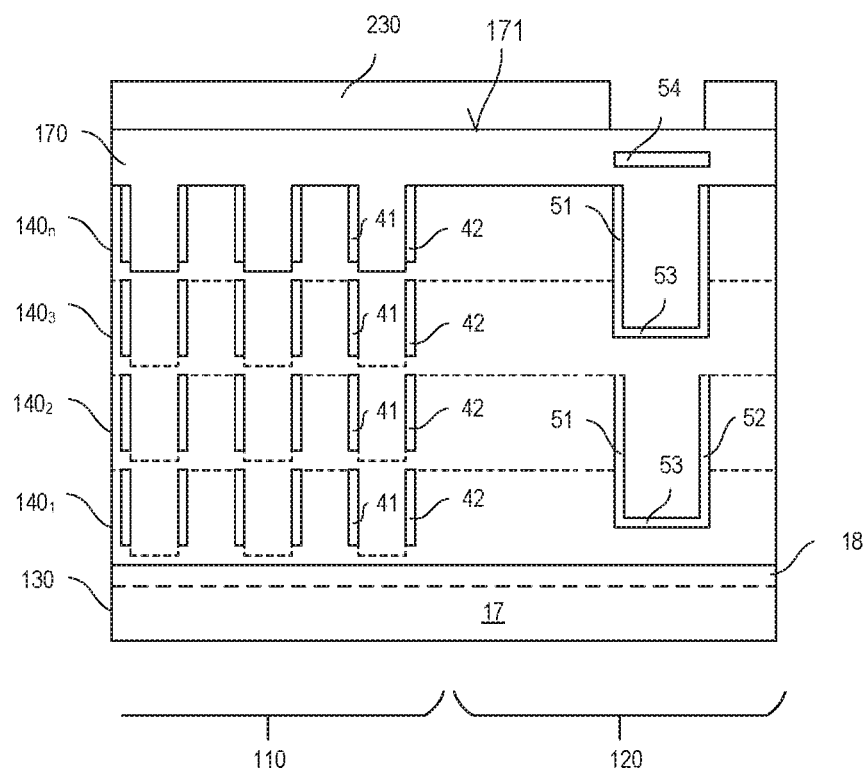
FIGS. 9 and 10 illustrate optional implantation processes.

Optionally, as illustrated in FIG. 9, an implantation mask 230 is formed on top of a surface 171 of the further semiconductor layer 170 and dopant atoms of the first doping type are implanted into the further semiconductor layer 170 using the implantation mask 230. In this implantation process, a further implanted region 54 that includes dopant atoms of the first doping type is formed in the edge region 120.

Figure 10:
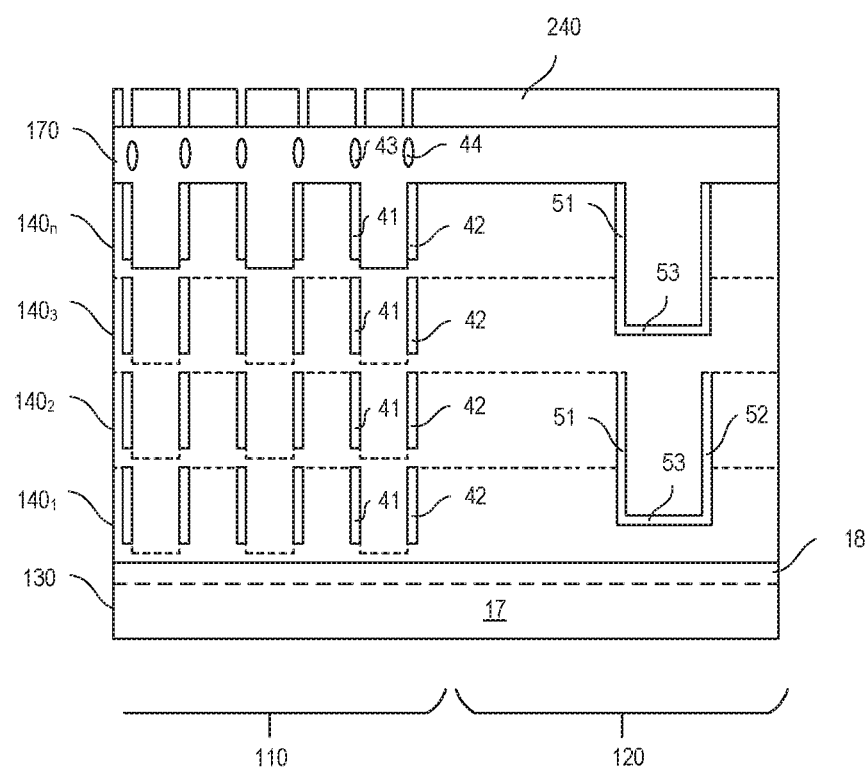

Additionally or alternatively to the process illustrated in FIG. 9, the method, referring to FIG. 10, further includes forming at least one third implanted region 43 above the first implanted regions 41 and at least one fourth implanted region 44 above the second implanted regions 42 in the further semiconductor layer 170 using at least one further implantation mask 240. The third implanted regions 43 are of the same type as the first implanted regions 41. That is, the third implanted regions 43 either include dopants of only one of the first and second doping type or dopants of both doping types, and the fourth implanted regions 44 either include dopants of only one of the first and second doping types or dopants of both doping types. According to one example, the first and second implanted regions 41, 42 each include dopants of the first doping type and the second doping type. In this example, the third and fourth implanted regions are formed such that each of the third and fourth implanted regions 43, 43 includes both dopant atoms of the first doping type and dopant atoms of the second doping type. Third and fourth implanted regions of this type may be formed by using only one implantation mask 240 (illustrated in FIG. 10) that has openings at positions above the first and second implanted regions 41, 42.

Figure 11:
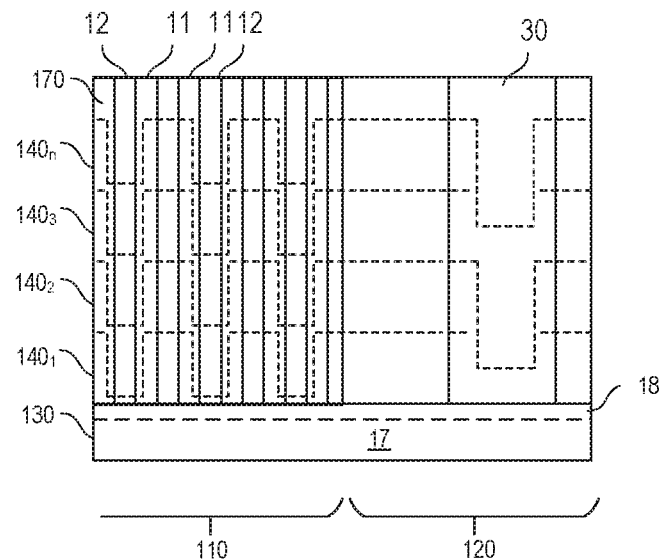
FIGS. 11 and 12 each illustrate the arrangement of FIG. 8 after a thermal process.

The method further includes a temperature process in which the dopants in the first and second implanted regions 41, 42, the dopant atoms in the optional third and fourth implanted regions 43, 44, the dopant atoms in the at least one implanted region 51-53 adjoining each second trench 160, and the dopant atoms in the optional implanted region 54 are activated and diffuse in order to form the drift regions 11 and the compensation regions 12 in the inner region 110 and the field stop region 30 in the edge region 120. According to one example, a temperature in the thermal process is between 1000° C. and 1200° C., and the duration of the thermal process is between 20 minutes and 10 hours. Optionally, the temperature process takes place in an oxidizing or wet oxidizing atmosphere. FIG. 11 shows a vertical cross sectional view of the semiconductor body 100 after the thermal process FIG. 11 illustrates an example in which the first and second implanted regions 41, 42 include dopant atoms of both the first doping type and the second doping type, and FIG. 12 includes an example in which the first implanted regions 41 include dopant atoms of one of the first and second doping type only and the second implanted regions 42 include dopants of the other one of the first and second doping type only.

Referring to the above, the first trenches 150 can be formed such that they are aligned in the vertical direction, so that the first implanted regions 41 are formed essentially one above the other and the second implanted regions 42 are formed essentially one above the other. The resulting drift and compensation regions 11, 12 are elongated regions in the vertical direction z of the semiconductor body 100. The second trenches 160 in the selected semiconductor layers 160 can be aligned in the vertical directions, as illustrated in FIGS. 8 to 10, or can be offset relative to one another in the lateral direction, as illustrated in FIG. 3. In each case, the second trenches 160 are positioned relative to each other such that in the thermal process the dopant atoms in the at least one implanted region along the second trenches diffuse such that a contiguous field stop region 30 is formed. By forming a second trench 160 only in selected ones of the semiconductor layers the field stop region 30 can be generated at reasonable cost.

Referring to the above, at least one implanted region 51, 52, 53 is formed adjacent at least one surface of each of the second trenches formed in the selected semiconductor layers $140_j$ so that, after the plurality of semiconductor layers $140_1$-$140_n$ have been formed, there are two or more implanted regions that are spaced apart from each other in the vertical direction z. An example of implanted regions 51-53 that are spaced apart from each other in the vertical direction is illustrated in FIG. 3. According to one example, the duration of the thermal process is adapted to a vertical distance of these implanted regions and a diffusion rate of the implanted dopant atoms such that a contiguous field stop region 30 is formed.

According to one example, dopant atoms implanted into the second trenches 160 in order to form at least one implanted regions adjacent each second trench 160 are selected such that they diffuse faster than dopant atoms of the same doping type implanted into the first trenches 150. According to one example, the first type dopant atoms implanted into the first trenches 150 are arsenic (As) atoms, the field stop region 30 is a region of the first doping type and the dopant atoms implanted into the second trenches 160 are phosphorous (P) atoms. Each of As and P is an n-type dopant in silicon, wherein P diffuses faster than As.

According to another example, dopant atoms implanted into the second trenches 160 in order to form at least one implanted regions adjacent each second trench 160 and dopant atoms implanted into the first trenches 150 have similar diffusion rates. Thus, arsenic may be implanted into the first trenches 150 in order to form the drift regions and into the second trenches 160 in order to form the field stop region. According to another example, boron is implanted into the first trenches 150 in order to form the compensation regions 12 and into the second trenches in order to form the field stop region 160.

Figure 12:
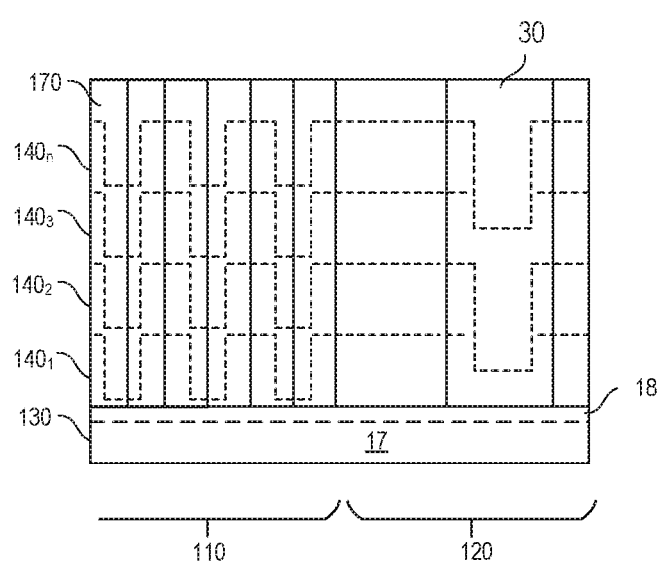

Based on a structure according to one of FIGS. 11 and 12, the transistor device is completed by forming the body regions 13 and the source regions 14 in the further semiconductor layer 170, by forming the gate electrode 15 and the gate dielectric 16, and by forming the source electrode 21. Methods for forming these device features are commonly known so that no further explanations are required in this regard.

Figure 13:
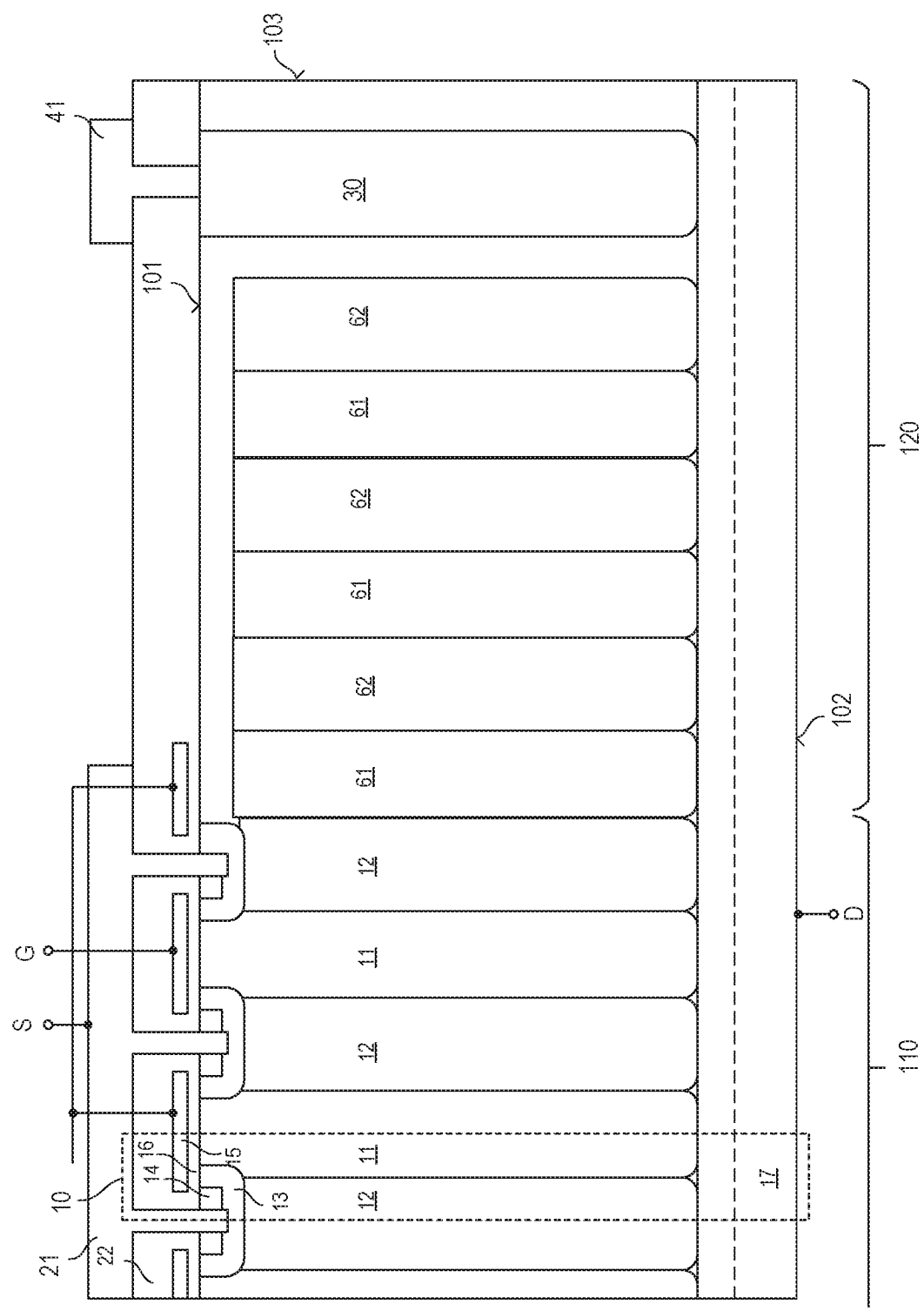
FIG. 13 shows a modification of the transistor device shown in FIG. 1.

FIG. 13 shows a modification of the transistor device shown in FIG. 1. In this example, several doped regions 61 of the first doping type and several doped regions 62 of the second doping type are included in the edge region 120 between the field stop region 30 and the inner region 110. The first regions 61 can be formed by the same process steps by which the drift regions 11 are formed in the inner region 110, and the second regions 62 can be formed by the same process steps by which the compensation regions 12 are formed in the inner region 110. The first and second regions 61, 62 located in the edge region 120, however, do not adjoin any body regions 13 of transistor cells.

Figure 14:
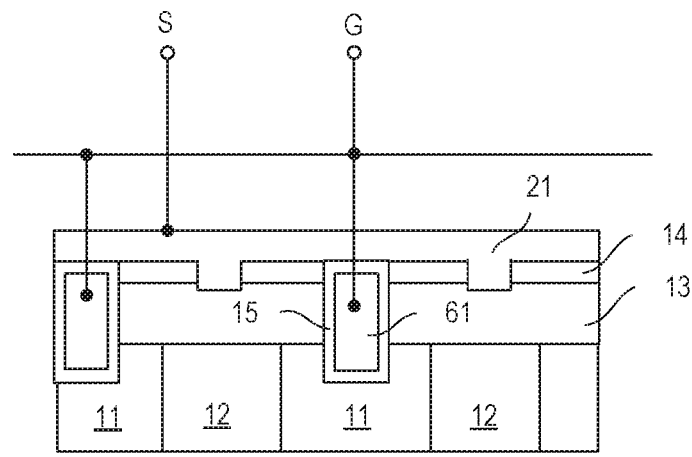
FIG. 14 illustrates one example of a trench transistor cell.

In the examples illustrated in FIGS. 1 and 13, the transistor cells include a planar gate electrode 14 arranged on top of the surface 101 of the semiconductor body 100. This, however, is only an example. According to another example illustrated in FIG. 14, the transistor cells may be implemented with trench gate electrodes 15 as well. It should be noted that FIG. 14 only illustrates those sections of several transistor cells 10 that include the gate electrodes 15.

Figure 15:
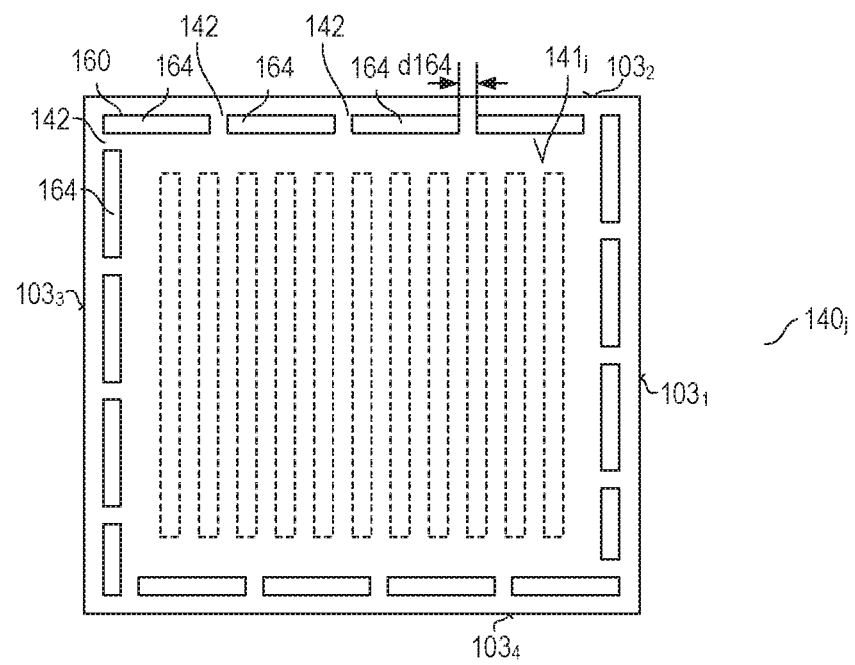
FIG. 15 shows a top view of a second trench that includes a plurality of trench sections.

In the examples explained above, the second trench 160 in each selected semiconductor layer $140_j$ forms a closed loop around the inner region 110. This, however, is only any example. According to another example illustrated in FIG. 15, the second trench 160 includes a plurality of trench sections (trench segments) 164 that are spaced apart from each other by mesa regions 142 of the semiconductor layer $140_j$. The mesa regions 142 are regions of the semiconductor layer $140_j$ that separate two trench sections and extend to the surface $141_j$ of the semiconductor layer $140_j$. The trench sections 164 and the mesa regions 142 form a trench mesa region structure that forms a closed loop around the inner region 110.

A distance d164 between two neighboring trench sections 164, that is, a width of the mesa regions 142 is such that in the thermal process the dopant atoms implanted into surfaces of the trench sections 164 can diffuse in lateral directions such that a contiguous field stop region 30 is formed that forms a closed loop around the inner region 110.

Figure 16A:
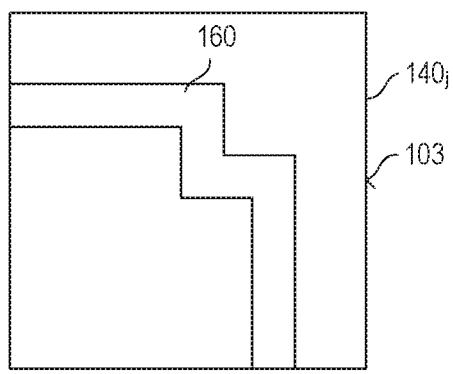
FIGS. 16A and 16B show top views of different corner sections of a second trench.
Figure 16B:
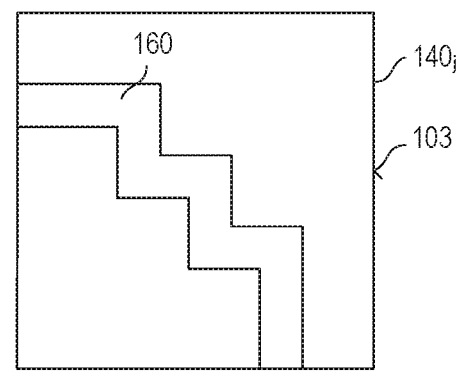

Further, in the examples explained above, the second trench 160 has one essentially right angle in each of the corners of the respective semiconductor layer $140_j$. This, however, is only an example. According to other examples illustrated in FIGS. 16A and 16B, the second trench 160 includes two or more step-like sections in one or more of the corners.

Although the present disclosure is not so limited, the following numbered examples demonstrate one or more aspects of the disclosure.

Example 1

A method, including: forming active regions of plurality of transistor cells in an inner region of a semiconductor body, wherein each transistor cell includes a drift region of a first doping type and a compensation region of a second doping type; and forming a field stop region of one of the first doping type and the second doping in an edge region of the semiconductor body, wherein forming the drift and compensation regions includes: forming a plurality of semiconductor layers one on top of the other; in each of the plurality of semiconductor layers, before forming a respective next one of the plurality of semiconductor layers, forming a plurality of first trenches and implanting at least one of dopant atoms of the first doping type and dopant atoms of the second doping type into sidewalls of the plurality of first trenches, and wherein forming the field stop region includes: in each semiconductor layer of a selection of the plurality of semiconductor layers, forming at least one second trench and implanting dopant atoms of one of the first and second doping type at least into one surface of the at least one second trench.

Example 2

The method of example 1, wherein the dopant atoms implanted into at least one surface of the at least one second trench are selected such that they diffuse faster than the at least one of dopant atoms of the first doping type and dopant atoms of the second doping type implanted into at least one of the first and second sidewalls of the first trenches.

Example 3

The method of example 1 or 2, wherein implanting dopant atoms at least into one surface of the at least one second trench includes implanting dopant atoms into a bottom of the at least one second trench.

Example 4

The method of any one of the preceding examples, wherein in each of the selection of the plurality of semiconductor layers, implanting at least one of dopant atoms of the first doping type and dopant atoms of the second doping type into sidewalls of the plurality of first trenches includes implanting the at least one of dopant atoms of the first doping type and dopant atoms of the second doping type into sidewalls of the at least one second trench at the same time, wherein implanting dopant atoms of one of the first and second doping type at least into one surface of the at least one second trench is in addition to implanting the at least one of dopant atoms of the first doping type and dopant atoms of the second doping type into sidewalls of the at least one second trench.

Example 5

The method of any one of examples 1 to 4, wherein the field stop region is of the first doping type.

Example 6

The method of any one of examples 1 to 4, wherein the field stop region is of the second doping type.

Example 7

The method of any one of the preceding examples, wherein the selection of the plurality of semiconductor layers includes every m-th of the plurality of semiconductor layers, wherein m is an integer greater than 1.

Example 8

The method of any one of the preceding examples, wherein, in at least one semiconductor layer of the selection, forming the plurality of first trenches includes forming the plurality of first trenches together with the at least one second trench.

Example 9

The method of example 8, wherein the method further includes: before implanting the dopant atoms of the first doping type into at least one surface of the at least one second trench, forming a protection layer over the first trenches.

Example 10

The method of any one of the preceding examples, wherein forming the plurality of semiconductor layers includes forming a lowermost one of the plurality of semiconductor layers on top of a carrier.

Example 11

The method of any one of the preceding examples, wherein forming the plurality of transistor cells further includes: forming at least one further semiconductor layer on top of an uppermost one of the plurality of semiconductor layers; and forming body regions and source regions of the transistor cells in the at least one further semiconductor layer.

Example 12

The method of example any one of the preceding examples, wherein implanting dopant atoms into the at least one surface of the second trench includes implanting dopant atoms of the first doping type into opposing sidewalls of the second trench and into a bottom of the second trench.

Example 13

The method of example 12, wherein the second trench forms a closed loop around the inner region.

Example 14

The method of example 12, wherein the second trench includes a plurality of trench sections separated by mesa regions, wherein an arrangement including the trench sections and the mesa regions forms a closed loop around the inner region.

Example 15

The method of example 13 or 14, wherein implanting the dopant atoms into at least one surface of the second trench includes four tilted implantation processes.

Example 16

The method of any one of examples 1 to 15, wherein implanting at least one of dopant atoms of the first doping type and dopant atoms of the second doping type into the sidewalls of the plurality of first trenches includes: implanting dopant atoms of only the first doping type into first sidewalls; and implanting dopant atoms of only the second doping type into second sidewalls opposite the first sidewalls.

Example 17

The method of any one of examples 1 to 15, wherein implanting at least one of dopant atoms of the first doping type and dopant atoms of the second doping type into the sidewalls of the plurality of first trenches includes: implanting dopant atoms of both the first doping type and the second doping type into each of first sidewalls and second sidewalls opposite the first sidewalls.

Example 18

The method of any one of the preceding examples, further including a thermal process at a temperature of between 1000° C. and 1200° C.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

The invention claimed is:

1. A method, comprising:
forming active regions of plurality of transistor cells in an inner region of a semiconductor body, wherein each transistor cell includes a drift region of a first doping type and a compensation region of a second doping type; and
forming a field stop region of one of the first doping type and the second doping type in an edge region of the semiconductor body,
wherein forming the drift and compensation regions comprises:
forming a plurality of semiconductor layers one on top of the other;
in each of the plurality of semiconductor layers, before forming a respective next one of the plurality of semiconductor layers, forming a plurality of first trenches and implanting at least one of dopant atoms of the first doping type and dopant atoms of the second doping type into sidewalls of the plurality of first trenches, and
wherein forming the field stop region comprises:
in each semiconductor layer of a selection of the plurality of semiconductor layers, forming at least one second trench and implanting dopant atoms of one of the first and second doping type at least into one surface of the at least one second trench,
wherein implanting dopant atoms of one of the first and second doping type at least into one surface of the at least one second trench comprises performing one or more additional implantation processes that prevent the dopant atoms of the one or more additional implantation processes from being implanted into the first trenches.

2. The method of claim 1,
wherein the dopant atoms implanted into at least one surface of the at least one second trench are selected such that they diffuse faster than the at least one of dopant atoms of the first doping type and dopant atoms of the second doping type implanted into at least one of the first and second sidewalls of the first trenches.

3. The method of claim 1,
wherein implanting dopant atoms at least into one surface of the at least one second trench comprises implanting dopant atoms into a bottom of the at least one second trench.

4. The method of claim 1,
wherein the field stop region is of the first doping type.

5. The method of claim 1,
wherein the field stop region is of the second doping type.

6. The method of claim 1, wherein the selection of the plurality of semiconductor layers comprises every m-th of the plurality of semiconductor layers, wherein m is an integer greater than 1.

7. The method of claim 1,
wherein, in at least one semiconductor layer of the selection, forming the plurality of first trenches comprises forming the plurality of first trenches together with the at least one second trench.

8. The method of claim 7, further comprising:
before implanting the dopant atoms of the first doping type into at least one surface of the at least one second trench, forming a protection layer over the first trenches.

9. The method of claim 1, wherein forming the plurality of semiconductor layers comprises forming a lowermost one of the plurality of semiconductor layers on top of a carrier.

10. The method of claim 1, wherein forming the plurality of transistor cells further comprises:
forming at least one further semiconductor layer on top of an uppermost one of the plurality of semiconductor layers; and
forming body regions and source regions of the transistor cells in the at least one further semiconductor layer.

11. The method of claim 1,
wherein implanting dopant atoms into the at least one surface of the second trench comprises implanting dopant atoms of the first doping type into opposing sidewalls of the second trench and into a bottom of the second trench.

12. The method of claim 1, wherein the second trench forms a closed loop around the inner region.

13. The method of claim 1,
wherein the second trench comprises a plurality of trench sections separated by mesa regions, wherein an arrangement comprising the trench sections and the mesa regions forms a closed loop around the inner region.

14. The method of claim 13, wherein the one or more additional implantation processes comprises four tilted implantation processes.

15. The method of claim 1, wherein implanting at least one of dopant atoms of the first doping type and dopant atoms of the second doping type into the sidewalls of the plurality of first trenches comprises:
implanting dopant atoms of only the first doping type into first sidewalls; and
implanting dopant atoms of only the second doping type into second sidewalls opposite the first sidewalls.

16. The method of claim 1, wherein implanting at least one of dopant atoms of the first doping type and dopant atoms of the second doping type into the sidewalls of the plurality of first trenches comprises:
implanting dopant atoms of both the first doping type and the second doping type into each of first sidewalls and second sidewalls opposite the first sidewalls.

17. The method of claim 1, further comprising a thermal process at a temperature of between 1000° C. and 1200° C.

18. The method of claim 1, further comprising forming a protection layer that fills each of the first trenches from the plurality of first trenches, wherein each of the one or more additional implantation processes are performed with each of the first trenches from the plurality of first trenches being filled by the protection layer, and wherein the protection layer prevents the dopant atoms of the one or more additional implantation processes from being implanted into the sidewalls of the first trenches.

19. The method of claim 1, wherein the plurality of semiconductor layers comprises a first one of the semiconductor layers and a second one of the semiconductor layers directly adjoining an upper surface of the first one of the semiconductor layers, wherein the plurality of first trenches comprise a first group of the first trenches that each extend from the upper surface of the first one of the semiconductor layers and a second group of the of the first trenches that each extend from an upper surface of the second one of the semiconductor layers, and wherein the at least one second trench extends from the upper surface of the second one of the semiconductor layers and extends past the upper surface of the first one of the semiconductor layers.

20. The method of claim 14, wherein each of the four tilted implantation processes comprise implanting dopant atoms of the first conductivity type.

21. The method of claim 14, wherein each of the four tilted implantation processes are performed at implantation vectors, wherein the implantation vectors differ with from one another respect to a horizontal component direction that extends parallel to an upper surface of the semiconductor body.

* * * * *